United States Patent
Kim

(10) Patent No.: US 7,184,006 B2
(45) Date of Patent: Feb. 27, 2007

(54) ORGANIC ELECTRO LUMINESCENT DISPLAY PANEL AND FABRICATING METHOD THEREOF

(75) Inventor: Keum-Nam Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/135,387

(22) Filed: May 24, 2005

(65) Prior Publication Data

US 2005/0264228 A1    Dec. 1, 2005

(30) Foreign Application Priority Data

May 25, 2004  (KR) .................. 10-2004-0037278

(51) Int. Cl.
*G09G 3/30* (2006.01)

(52) U.S. Cl. .......................................... 345/76; 345/92

(58) Field of Classification Search ............. 345/92, 345/76, 77, 80; 427/66; 438/99, 149; 315/169.1, 315/169.3; 313/483

See application file for complete search history.

(56) References Cited

U.S. PATENT DOCUMENTS

| | | | |
|---|---|---|---|
| 6,617,644 B1 * | 9/2003 | Yamazaki et al. | 257/347 |
| 6,780,687 B2 * | 8/2004 | Nakajima et al. | 438/149 |
| 2003/0116768 A1 * | 6/2003 | Ishikawa | 257/79 |
| 2003/0213966 A1 * | 11/2003 | Yang et al. | 257/93 |

* cited by examiner

*Primary Examiner*—Ricardo Osorio
(74) *Attorney, Agent, or Firm*—H.C. Park & Associates, PLC

(57) ABSTRACT

There is provided an organic EL display panel having a pixel circuit that increases the panel's aperture ratio by an improved structure of a unit pixel. The present invention discloses an organic EL display panel including at least one pixel circuit for driving each pixel, wherein the pixel circuit comprises at least one organic light emitting element, at least two thin film transistors and at least one capacitor per pixel. The thin film transistors respectively comprise a gate electrode and a semiconductor layer in which a channel region, a source region and a drain region are formed. The conductive layer contacted on the gate electrode of one of the thin film transistors is coupled to another thin film transistor and at least one capacitor.

11 Claims, 8 Drawing Sheets

ORGANIC ELECTRO LUMINESCENT DISPLAY PANEL AND FABRICATING METHOD THEREOF

CROSS REFERENCE TO RELATED APPLICATION

This application claims priority to and the benefit of Korean Patent Application No. 10-2004-0037278, filed on May 25, 2004, which is hereby incorporated by reference for all purposes as if fully set forth herein.

BACKGROUND OF THE INVENTION

1. Field of the Invention

The present invention relates to an organic electro luminescent (EL) display panel, and more particularly to an organic EL display panel in which an aperture ratio is increased by improving a structure of a unit pixel.

2. Description of the Background

An organic EL display uses light emitted from an electrically excited organic light emitting diode OLED to display characters or images. Electrons, supplied from a cathode, and holes, supplied from an anode, recombine to excite the organic material. Generally, the organic light emitting diode OLED includes an anode electrode layer, an emitting layer (EML) for facilitating supply of electrons and holes, an electron transport layer (ETL), a hole transport layer (HTL) and a cathode electrode layer.

Methods for driving organic EL displays are generally classified as passive or active matrix methods. The active matrix method may include a voltage programming method and a current programming method, depending on the form of a signal that charges a voltage into a capacitor and maintains the charged voltage.

FIG. 1 shows an equivalent circuit of a conventional active matrix-type organic EL display driven by the voltage programming method. Referring to FIG. 1, pixels may be arranged in the form of a matrix defined by intersections among scan lines $S_1$ to $S_n$, data lines $D_1$ to $D_m$, and power lines $V_1$ to $V_m$, and each pixel may include a switching thin film transistor ST, a driving thin film transistor DT, and a storage capacitor $C_{ST}$.

In each pixel, a source electrode, a gate electrode, and a drain electrode of the switching thin film transistor ST are coupled to data lines $D_1$ to $D_m$, scan lines $S_1$ to $S_n$, and a gate electrode of the driving thin film transistor DT, respectively. The storage capacitor $C_{ST}$ is coupled between the drain electrode of the switching thin film transistor ST and a power lines Vn. A source electrode and a drain electrode of the driving thin film transistor DT are coupled to the power line Vn and an organic light emitting element OLED, respectively. The drain electrode of the driving thin film transistor DT may be electrically connected an anode electrode of the organic light emitting element OLED. A cathode electrode of the organic light emitting element OLED may be supplied with a common voltage for all pixels.

When the switching thin film transistor ST turns on from a selection signal applied to its gate electrode, a data voltage from the data lines $D_1$ to $D_m$ is applied to the gate electrode of the driving thin film transistor DT. Then, in response to a voltage $V_{GS}$ charged in the storage capacitor $C_{ST}$ between the gate electrode and the source electrode of the driving thin film transistor DT, a current $I_{OLED}$ may flow through the organic light emitting element OLED via the driving thin film transistor DT, thereby emitting light from the organic light emitting element OLED.

In the voltage programming method as described above, a problem may arise in that brightness of an organic EL display panel may not be uniform due to deviation in characteristics of driving thin film transistors, such as threshold voltage or channel mobility.

Accordingly, complementary circuits for correcting this deviation in characteristics have been proposed. However, increasing the number of thin film transistors may decrease the pixel's aperture ratio.

On the other hand, assuming that a current source for supplying a current to pixel circuits is uniform for the entire panel, i.e., all data lines, the current programming type organic EL display may obtain uniform display characteristics even when the pixels' driving thin film transistors have a non-uniform voltage-current characteristic.

FIG. 2 is a pixel circuit showing a conventional current programming method for driving an organic EL display, where a single pixel is shown. Referring to FIG. 2, a driving thin film transistor DT is coupled to an organic light emitting element OLED to supply a current for emitting light, and a data current $I_{DATA}$, which is applied through a switching thin film transistor ST1, controls the amount of current flowing through the driving thin film transistor DT.

When switching thin film transistors ST1 and ST2 are turned on by a selection signal from a scan line $S_n$, the driving thin film transistor DT is diode connected. Consequently, a storage capacitor $C_{ST}$ is charged to a voltage as a current flows through it. Namely, a potential of a gate electrode of the driving thin film transistor DT drops, thereby causing the current to flow from a source electrode of the driving thin film transistor DT to a drain electrode of the driving thin film transistor DT, so that the storage capacitor $C_{ST}$ is charged to the voltage corresponding to the data current $I_{DATA}$ for setting brightness. Next, the switching thin film transistors ST1 and ST2 are turned off, and a thin film transistor ET, which is coupled to an emission control line $E_n$, is turned on. Then, power is supplied from a power supply line VDD, and a current $I_{OLED}$ corresponding to the charged voltage of the storage capacitor $C_{ST}$ flows through the organic light emitting element OLED to emit light with a preset brightness.

However, since the current $I_{OLED}$ flowing through the organic light emitting element OLED may be minute, and the voltage range of the data line $D_m$ may be wide, it may take a relatively long time to charge a parasite capacitor of the data line.

Additionally, increasing the number of thin film transistors disposed in a unit pixel may significantly reduce the aperture ratio, which may deteriorate brightness. Furthermore, the display's lifetime may be reduced if the pixel circuits are driven with a high current.

SUMMARY OF THE INVENTION

The present invention provides an organic EL display panel wherein an aperture ratio is increased by improving an arrangement structure of a unit pixel.

Additional features of the invention will be set forth in the description which follows, and in part will be apparent from the description, or may be learned by practice of the invention.

The present invention discloses an organic EL display panel including at least one pixel circuit for driving each pixel, wherein the pixel circuit comprises at least one organic light emitting element, at least two thin film transistors and at least one capacitor per pixel. The thin film transistors respectively comprise a gate electrode and a semiconductor layer in which a channel region, a source region and a drain region are formed. The conductive layer contacted on the gate electrode of one of the thin film transistors is coupled to another thin film transistor and at least one capacitor.

The present invention also discloses a method for fabricating an organic EL display panel, comprising the steps of: forming a common semiconductor layer for at least two thin film transistors on an insulation substrate, forming a gate insulation film covering the semiconductor layer, forming gate electrodes for the at least two thin film transistors on the gate insulation film, forming a interlayer insulation film covering the gate electrode, forming a contact hole for exposing the gate electrode of one of thin film transistors, and forming a conductive layer inside the contact hole and the interlayer insulation.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the is principles of the invention.

DETAILED DESCRIPTION OF THE ILLUSTRATED EMBODIMENTS

Figure 1:
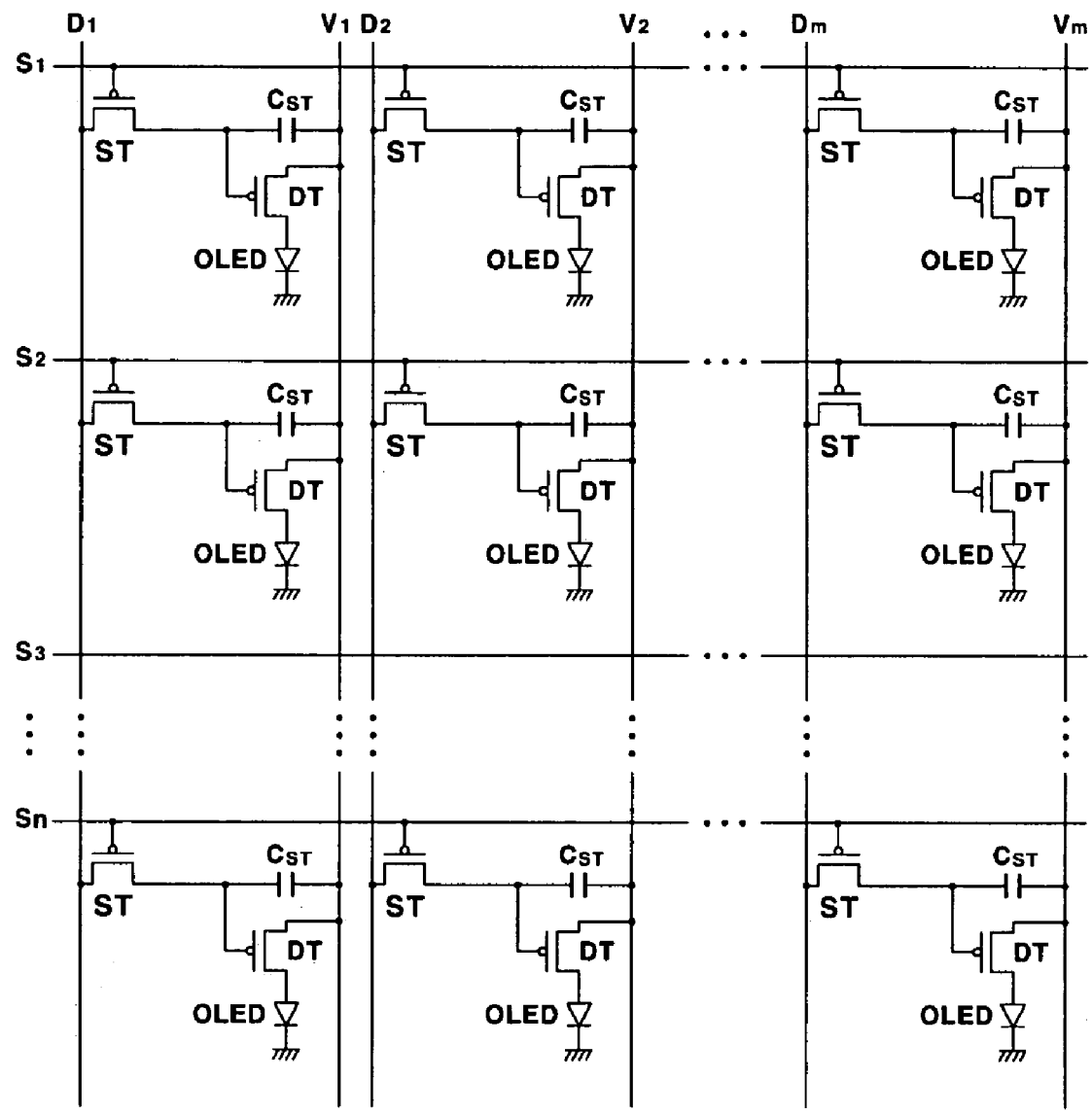
FIG. 1 is an equivalent circuit showing a conventional active matrix-type organic EL display.
Figure 2:
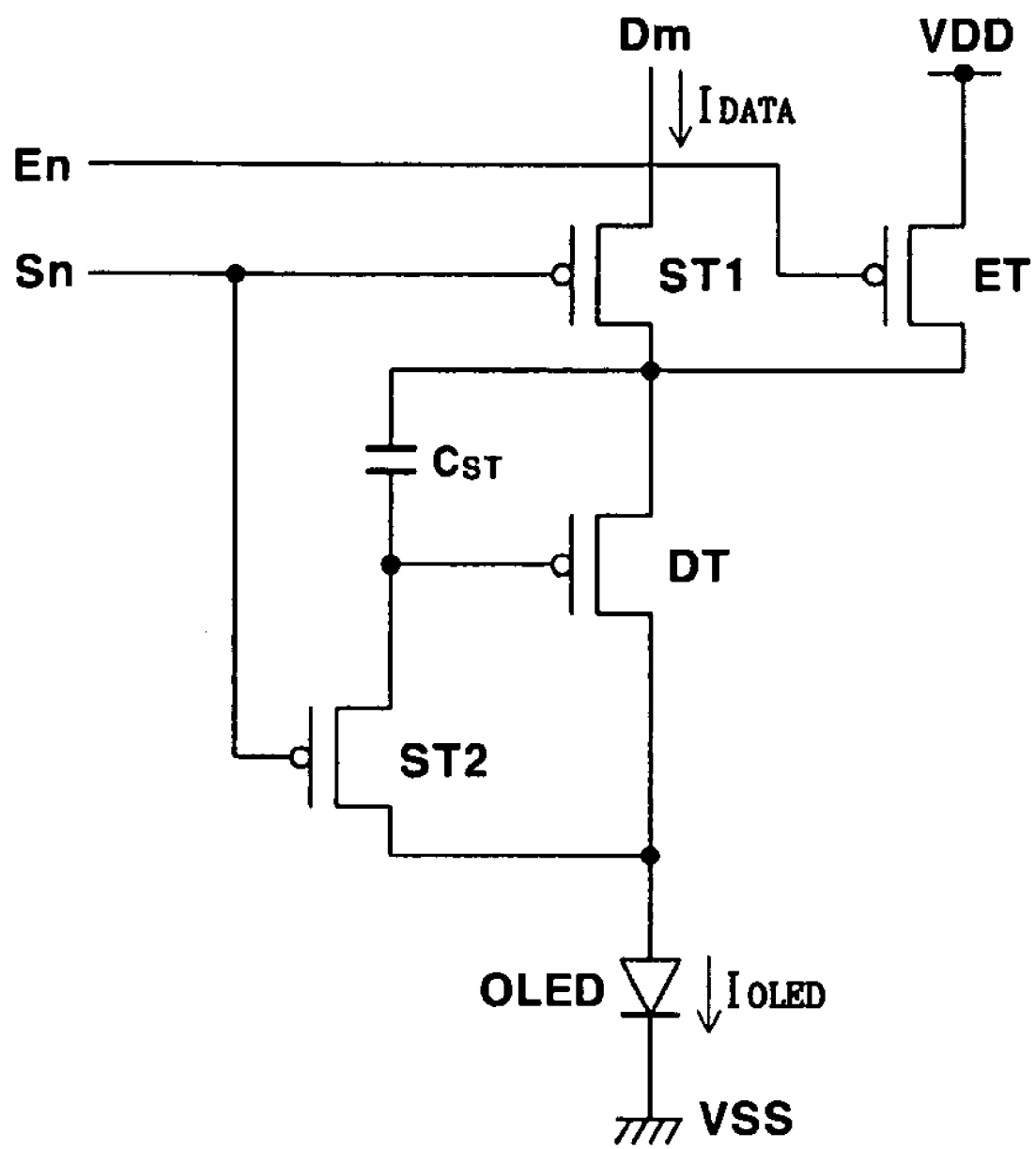
FIG. 2 is a pixel circuit diagram showing a conventional current programming method for driving a conventional organic EL display.

The following detailed description shows and describes exemplary embodiments of the present invention. As those skilled in the art would recognize, the described exemplary embodiments may be modified in various ways, all without departing from the spirit or scope of the present invention.

In the drawings, illustrations of elements having no relation with the present invention are omitted in order to prevent the subject matter of the present invention from being unclear. In the specification, the same or similar elements are denoted by the same reference numerals even though they are depicted in different drawings. As used herein, a coupling between one element and another element includes not only a direct coupling therebetween but also an indirect coupling therebetween with other elements interposed therebetween. In addition, forming one element such as a layer, a film, a region or a plate on another element includes not only forming the former immediately above the latter but also forming the former above the latter with other elements interposed therebetween.

Figure 3:
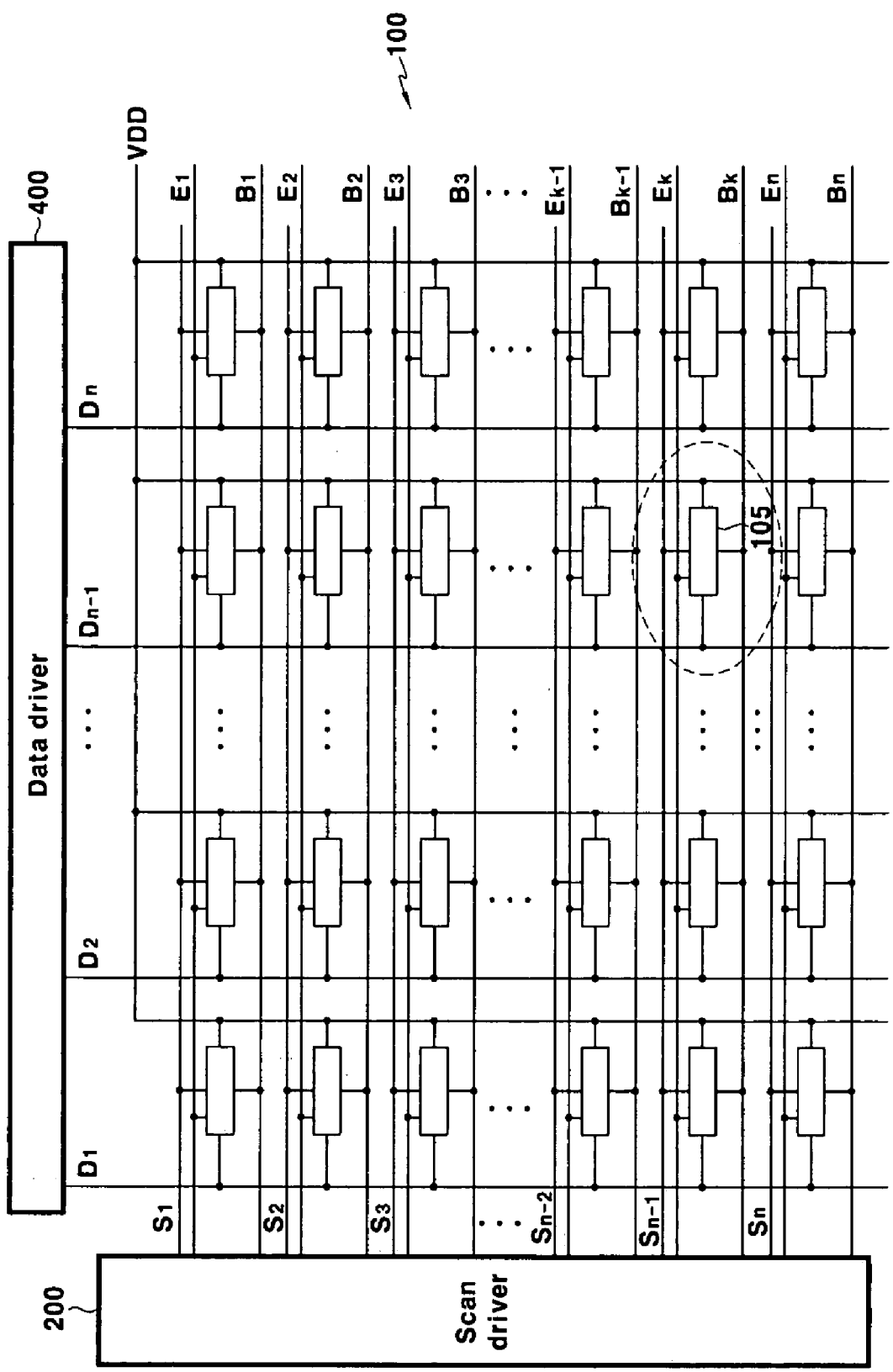
FIG. 3 is a schematic diagram showing a structure of an organic EL display according to exemplary embodiments of the present invention.

FIG. 3 is a schematic diagram showing a structure of an organic EL display according to an exemplary embodiment of the present invention.

Referring to FIG. 3, the organic EL display may include a display panel 100, a scan driver 200, and a data driver 400. The display panel may include a plurality of scan lines $S_1$ to $S_n$, a plurality of emission control lines $E_1$ to $E_n$ and a plurality of boost control lines $B_1$ to $B_n$ extending in a row direction, and a plurality of data lines $D_1$ to $D_n$ and a plurality of power lines VDD extending in a column direction. A plurality of pixels 105 may be formed between intersections of these lines.

The pixels 105 may be formed in a pixel region defined by two adjacent scan lines $S_{k-1}$ and $S_k$ and two adjacent data lines $D_{k-1}$ and $D_k$, and they may be driven by signals transmitted from the scan lines, the emission control lines $E_1$ to $E_n$, the boost control lines $B_1$ to $B_n$, and the data lines.

Additionally, the scan driver 200 may sequentially transmit a selection signal to select a corresponding scan line, which allows application of a data signal to that scan line's pixels, and it may sequentially transmit an emission control signal to the emission control lines $E_1$ to $E_n$ to control emission of the organic light emitting element OLED.

Figure 4:
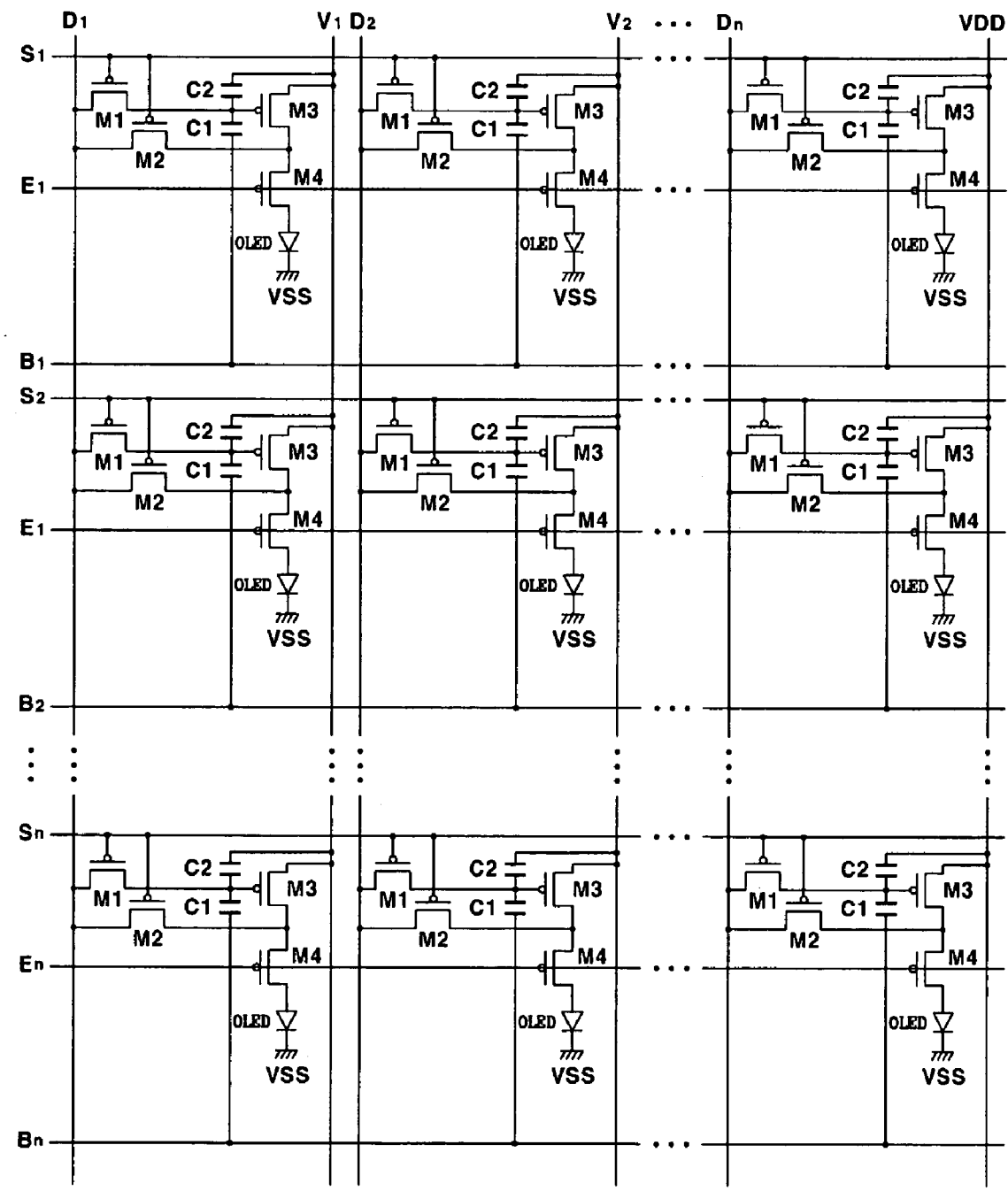
FIG. 4 is a schematic diagram showing an organic EL display panel according to an exemplary embodiment of the present invention.

The scan driver 200 may also apply a boost signal to pixels of a corresponding boost control line B1 to Bn to increase the gate voltage of a driving thin film transistor using two capacitors (C1 and C2 in FIG. 4). Accordingly, a current supplied to the organic light emitting element OLED may be set to a desired value.

In the mean time, the data driver 400 applies a data signal via the data lines $D_1$ to $D_n$ to pixels of a selected scan line.

In this way, the scan driver 200 and the data driver 400 may be respectively coupled to a substrate of the display panel 100, respectively. Alternatively, the scan driver and/or the data driver may be directly formed on a glass substrate of the display panel 100, or they may be replaced with any driving circuit that may be formed on the same layer as the scan lines, the data lines and the transistors on the substrate of the display panel 100. Additionally, the scan and/or data drivers may be formed in the form of a chip on a tape carrier package (TCP), a flexible printed circuit (FPC), or a tape automatic bonding (TAB), which are bonded and coupled to the substrate of the display panel.

Next, an operation of the organic EL display will be described in detail with reference to FIG. 4 and FIG. 5.

Figure 5:
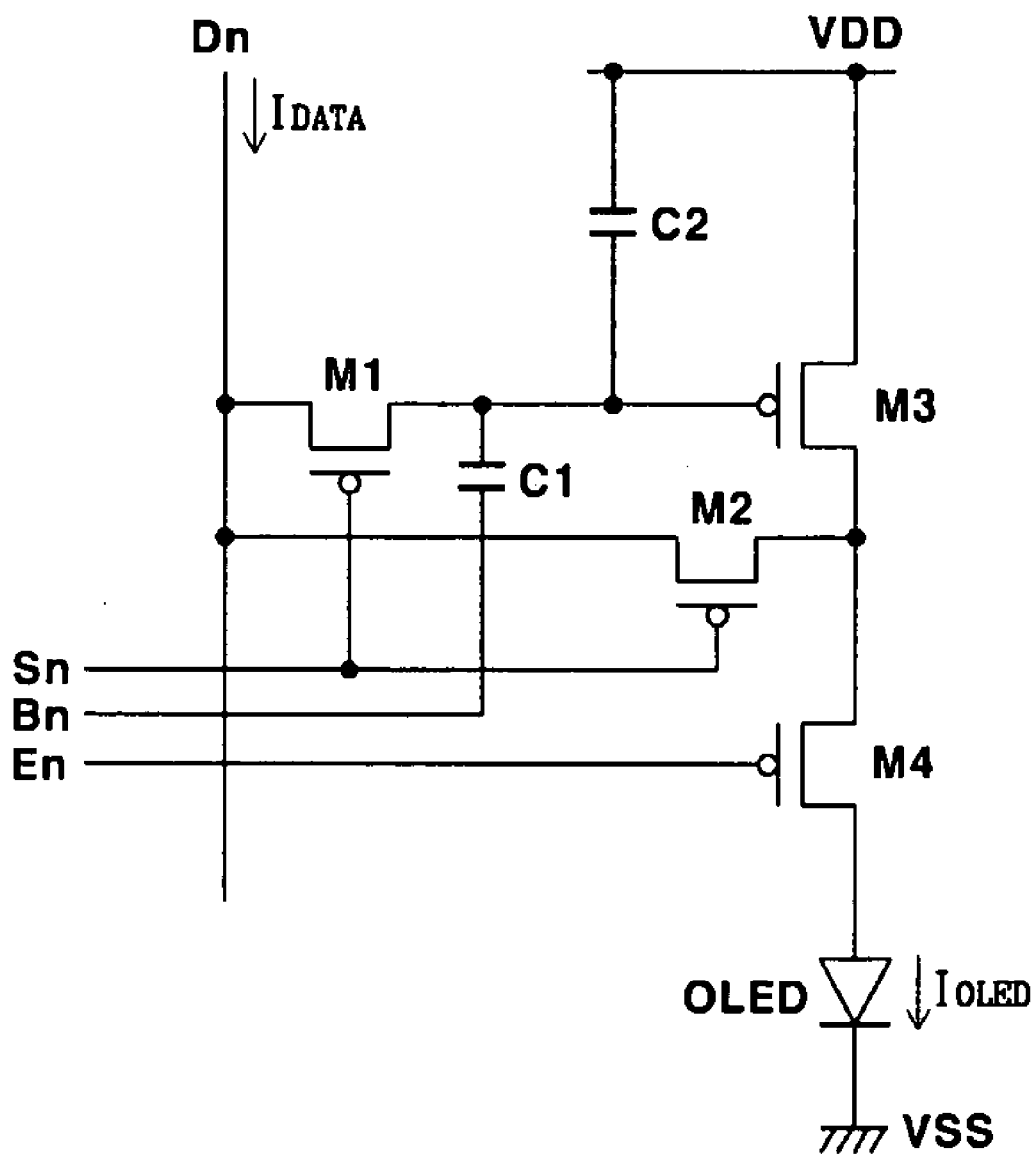
FIG. 5 is an equivalent circuit showing a pixel of FIG. 4.

FIG. 4 is a schematic diagram showing the display panel according to an exemplary embodiment of the present invention, and FIG. 5 is an equivalent circuit showing a single pixel of FIG. 4.

Referring to FIG. 4 and FIG. 5, a display panel pixel circuit may include a driving transistor M3, an emission transistor M4, a switching transistor M1, a diode transistor M2, an organic light emitting element OLED, and two capacitors C1 and C2.

In more detail, the switching transistor M1 may be coupled between the data line $D_n$ and the gate electrode of the driving transistor M3, and in response to the selection signal from the scan line $S_n$, it transmits the current $I_{DATA}$ from the data line $D_n$ to the driving transistor M3. The diode transistor M2 may be coupled between the drain region of the driving transistor M3 and the data line $D_n$ to diode-connect the driving transistor M3 in response to the selection signal from the scan line $S_n$.

Additionally, source and drain regions of the driving transistor M3 may be coupled to the power line VDD and the drain region of the diode transistor M2, respectively. A gate-source voltage of the driving transistor M3 may be determined according to the data current $I_{DATA}$.

The second capacitor C2 may be coupled between the gate electrode and the source region of the driving transistor M3 to maintain the gate-source voltage of the driving transistor M3 during a period of time, and the first capacitor C1 may be coupled between the boost control line $B_n$ and the gate electrode of the driving transistor M3 to adjust a gate electrode voltage of the driving transistor M3.

By coupling the capacitors C1 and C2 as shown in FIG. 4 and FIG. 5, a voltage of the first capacitor C1 may increase by an increase of a boost control signal voltage ($\Delta V_B$) applied from the boost control line $B_n$. Hence, the gate electrode voltage increase ($\Delta V_G$) of the driving transistor M3 may be obtained according to Equation 1. Therefore, by adjusting the increase of the boost control signal voltage ($\Delta V_B$) corresponding to parasite capacitive components of the transistors M1, M2 and M3, the gate electrode voltage increase ($\Delta V_G$) of the driving transistor M3 may be set to a desired value.

$$\Delta V_G = \frac{\Delta V_B C_2}{C_1 + C_2} \quad \text{Equation 1}$$

Next, in response to the emission signal from the emission control line $E_n$, the emission transistor M4 supplies a current flowing through the driving transistor M3 to the organic light emitting element OLED. The organic light emitting element OLED may be coupled between the emission transistor M4 and a reference voltage VSS to emit light corresponding to the amount of current $I_{OLED}$ flowing through the driving transistor M3.

Operation of the pixel circuit described above will be now described in detail.

First, the switching transistor M1 and the diode transistor M2 are turned on by the selection signal applied through the scan line $S_n$. Accordingly, the driving transistor M3 is diode-connected, and the data current $I_{DATA}$ from the data line $D_n$ flows into the driving transistor M3. Simultaneously, since the emission transistor M4 is turned off by the emission signal applied through the emission scan line $E_n$, the driving transistor M3 and the organic light emitting element OLED are electrically insulated from each other.

At this time, Equation 2 shows the relationship between an absolute value of a voltage $V_{GS}$ between the gate and the source of the driving transistor M3 and the data current $I_{DATA}$ flowing through the driving transistor M3, and Equation 3 gives the gate-source voltage $V_{GS}$.

$$I_{DATA} = \frac{\beta}{2}(V_{GS} - V_{TH})^2 \quad \text{Equation 2}$$

Where, $\beta$ is a constant and $V_{TH}$ is the absolute value of a threshold voltage of the driving transistor M3.

$$V_{GS} = V_{DD} - V_G = \sqrt{\frac{2I_{DATA}}{\beta}} + V_{TH} \quad \text{Equation 3}$$

Where, $V_G$ is a voltage of the gate electrode of the driving transistor M3, and $V_{DD}$ is a voltage supplied to the driving transistor M3 by a power line VDD.

Next, the switching transistor M1 and the diode transistor M2 are turned off by the selection signal of the scan line $S_n$, and the emission transistor M4 is turned on by the emission signal of the emission control signal $E_n$.

At this time, a voltage at a point of contact between the second capacitor C2 and the first capacitor C1 may rise by an increase of the boost control signal voltage ($\Delta V_B$) applied from the boost control line $B_n$. Accordingly, the gate voltage $V_G$ of the driving transistor M3 may rise by a coupling between the capacitors C1 and C2, and Equation 1 noted above gives the gate voltage increase $\Delta V_G$.

Since the gate voltage $V_G$ of the driving transistor M3 increases by $\Delta V_G$, the current $I_{OLED}$ flowing through the driving transistor M3 may be determined by the Equation 4. Namely, since the gate-source voltage $V_{GS}$ decreases by the gate voltage increase $\Delta V_G$, the magnitude of the current $I_{OLED}$ of the driving transistor M3 may be less than that of the data current $I_{DATA}$. Additionally, since the emission transistor M4 is turned on by the emission signal of the emission control line En, the current $I_{OLED}$ of the driving transistor M3 may be supplied to the organic light emitting element OLED.

$$I_{OLED} = \frac{\beta}{2}(V_{GS} - \Delta V_G - V_{TH})^2 = \frac{\beta}{2}\left(\sqrt{\frac{2I_{DATA}}{\beta}} - \Delta V_G\right)^2 \quad \text{Equation 4}$$

Equation 4 may be rearranged into Equation 5 to give the data current $I_{DATA}$. Equation 5 shows that the data current $I_{DATA}$ may be set at a greater value than the current $I_{OLED}$ flowing through the organic light emitting element OLED.

$$I_{DATA} = I_{OLED} + \Delta V_G \sqrt{2\beta I_{OLED}} + \frac{\beta}{2}(\Delta V_G)^2 \quad \text{Equation 5}$$

Figure 6:
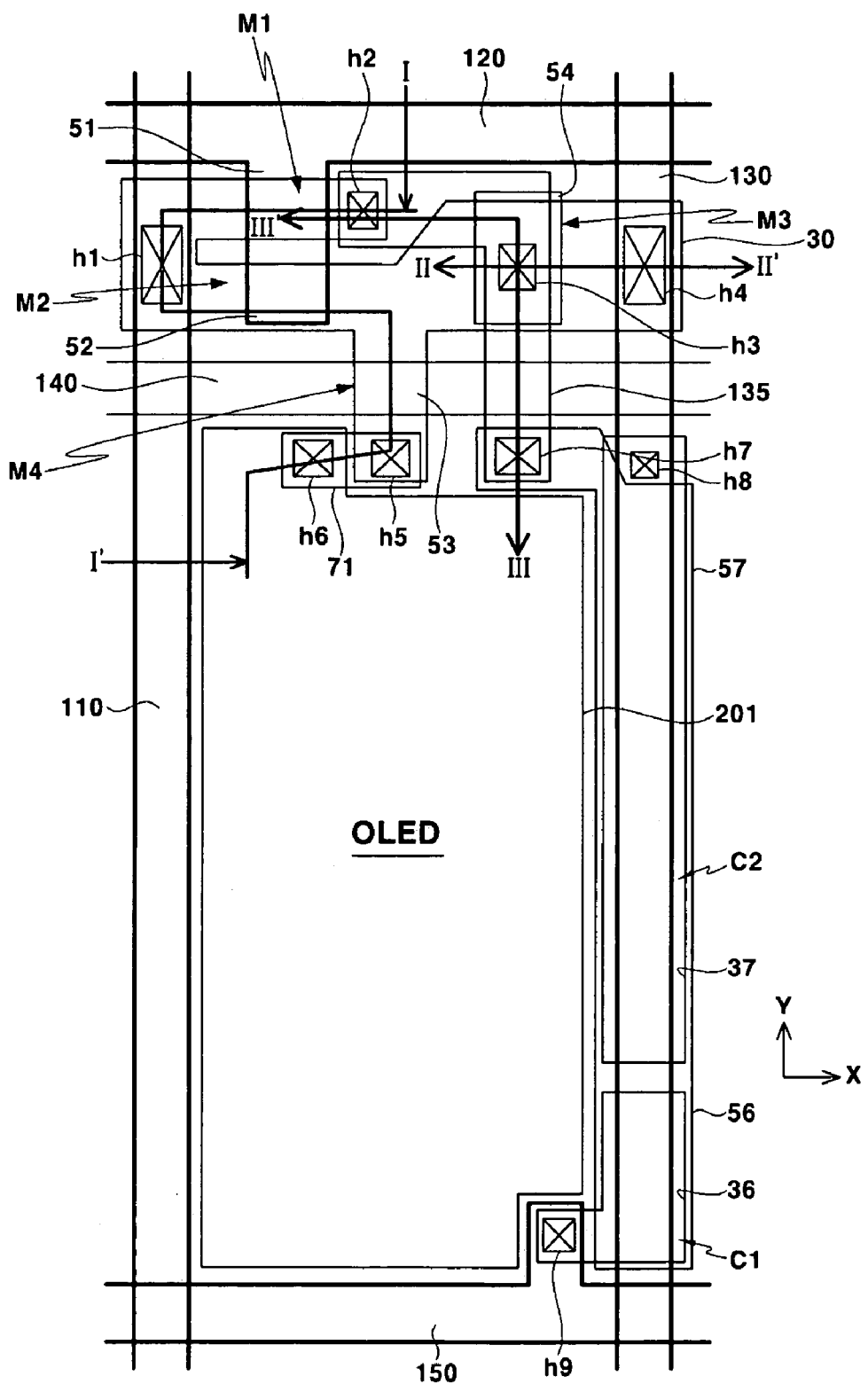
FIG. 6 is a diagram showing an arrangement of the organic EL display panel according to an exemplary embodiment of the present invention.
Figure 7:
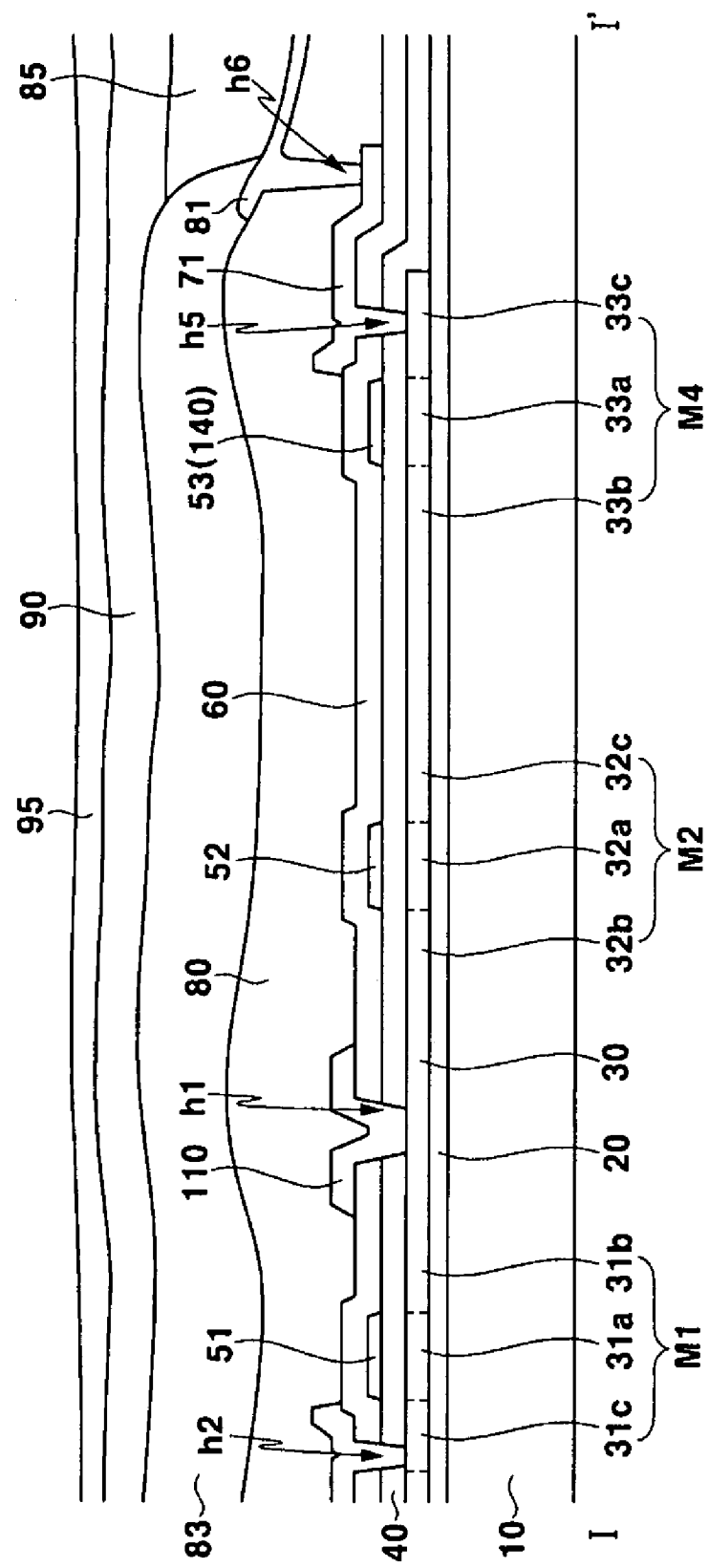
FIG. 7 is a sectional view taken along line I–I' of FIG. 6.
Figure 8:
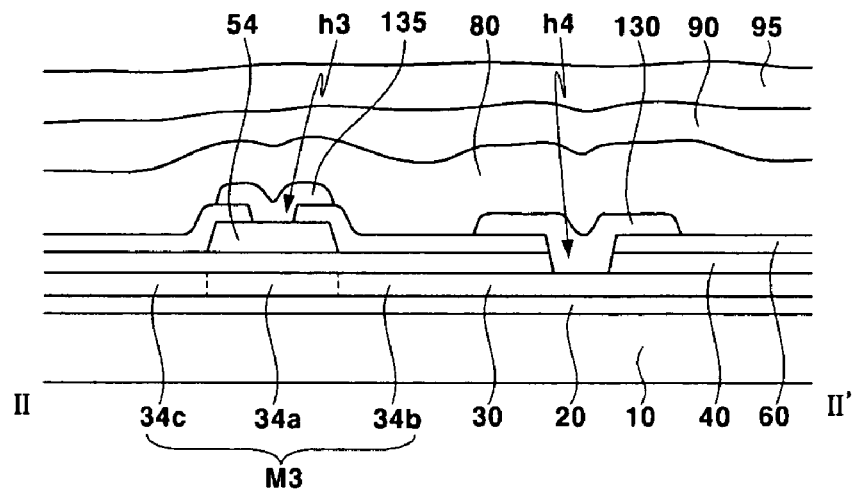
FIG. 8 is a sectional view taken along line II–II' of FIG. 6.
Figure 9:
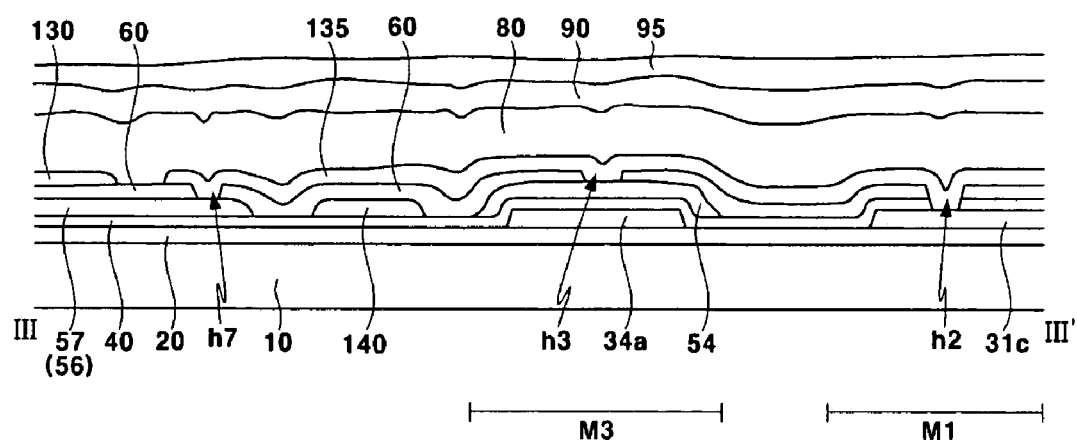
FIG. 9 is a sectional view taken along line III–III' of FIG. 6.

Hereinafter, a layout of the display panel according to an exemplary embodiment of the present invention will be described with reference to FIG. 6, FIG. 7, FIG. 8 and FIG. 9. FIG. 6 shows an arrangement of the display panel according to an exemplary embodiment of the present invention, and FIG. 7, FIG. 8 and FIG. 9 are sectional views taken along lines I–I', II–II' and III–III' of FIG. 6, respectively.

Referring to FIG. 6, FIG. 7, FIG. 8 and FIG. 9, pixels may be defined by a data line 110 extending in a first direction (the Y axis direction of FIG. 6), a scan line 120 arranged in a second direction (the X axis direction in FIG. 6) intersecting with the data line 110, a power line 130 extending parallel to the data line 110 and spaced therefrom by a constant interval, an emission control line 140 arranged in parallel to the scan line 120, and a boost control line 150 arranged in parallel to the emission control line 140 spaced therefrom by a constant interval.

Herein, the switching transistor M1, the driving transistor M3, the diode transistor M2 and the emission transistor M4 comprising the pixel circuit may be disposed in a space between the scan line 120 and the emission control line 140. Accordingly, since the boost control line 150 does not overlap with the elements comprising the pixel circuit, boost signal distortion due to interference between the elements of the pixel circuit may be prevented. Consequently, since the boost signal may be stably applied to the first capacitor C1, a current $I_{OLED}$ may be more precisely supplied to the organic light emitting element OLED.

The thin film transistors M1, M2, M3 and M4 respectively comprise a gate electrode 51, 52, 54 and 53 and a semiconductor layer 30 in which a channel region, a source region and a drain region are formed. In present invention, a semiconductor layer 30 of the switching transistor M1, the diode transistor M2, the driving transistor M3 and the emission transistor M4 may be formed as a common layer.

More specifically, the switching transistor M1 may be formed at the vicinity of an intersection between the scan line 120 and the data line 110. The source region of the switching transistor M1 is coupled to the data line 110 through a contact hole h1, and the drain region of the switching transistor M1 is coupled to the gate electrode 54 of the driving transistor M3 through contact holes h2 and h3 via a conductive layer 135. Herein, the drain region of the switching transistor M1 may be coupled to the gate electrode 54 of the driving transistor M3 through the conductive layer 135 having a inverse "L" like shape in FIG. 6, thereby reducing an area in which the pixel circuit is disposed and increasing an aperture ratio of the pixel, which will be described in detail later.

Additionally, the diode transistor M2 may be formed at the vicinity of an intersection between the data line 110 and the emission control line 140. The gate electrode 52 of the diode transistor M2 may be formed in common with the gate electrode 51 of the switching transistor M1. The source region of the diode transistor M2 is coupled to the data line 110 through the contact hole h1, the drain region of the diode transistor M2 is coupled to the drain region of the driving transistor M3 through the semiconductor layer 30.

The driving transistor M3 may be formed at an intersection between the scan line 120 and the power line 130. The gate electrode 54 of the driving transistor M3 is coupled to the drain region of the switching transistor M1 through the contact holes h3 and h2, the source region of the driving transistor M3 is coupled to the power line 130 through a contact hole h4, and the drain region of the driving transistor M3 is coupled to a source region of the emission transistor M4 through the semiconductor layer 30.

The emission transistor M4 may be formed across the emission control line 140. The gate electrode 53 of the emission transistor M4 may be formed by a portion of the emission control line 140 and the drain region of the emission transistor M4 may be coupled to the organic light emitting element OLED.

The capacitors C1 and C2 may overlap with the power line 130 in the vicinity of a long side 201 of the organic light emitting element OLED. A first electrode 36 of the first capacitor C1 is coupled to the boost control line 150 and a first electrode 37 of the second capacitor C2 is coupled to the power line 130. Second electrodes 56 and 57 of the capacitors C1 and C2 may be formed as a common layer. And, the second electrodes 56 and 57 of the capacitors C1 and C2 may be coupled to the gate electrode 54 of the driving transistor M3 through a contact hole h7. At this time, the second electrodes 56 and 57 of the capacitors C1 and C2 may be coupled to the drain region of the switching transistor M1 and the gate electrode 54 of the driving transistor M3 through the conductive layer 135 contacted on the gate electrode 54 of the driving transistor M3.

Now, an interlayer structure of the display panel having the above pixel circuit and a method for fabricating the organic EL display panel will be described.

The organic EL display panel according to an exemplary embodiment of the present invention may have a blocking layer 20, which may be made from silicon oxide, silicon nitride, or other similar substances, that may be formed on an insulation substrate 10.

Thereafter, the semiconductor layer 30 for the switching transistor M1, the driving transistor M3, the diode transistor M2 and the emission transistor M4 formed as a common layer on the blocking layer 20. The semiconductor layer 30 is formed with polycrystalline silicon. The semiconductor layer 30 may be formed by a laser crystalline method on a semiconductor film having an amorphous structure. Also, the first electrodes 36 and 37 of the first and second capacitors C1 and C2 may be formed on the blocking layer 20.

Thereafter, a gate insulation film 40, which may be made from silicon oxide, silicon nitride, or other like materials, may be formed on the semiconductor layer 30. A hole h9 exposing the first electrode 36 of the first capacitor C1.

Thereafter, the scan line 120, which may include a conductive film made from conductive material with low resistance such as aluminum or aluminum alloy, and the gate electrodes 51, 52, 53 and 54 of the transistors M1, M2, M4 and M3, may be formed on the gate insulation film 40. The emission control line 140 and the boost control line 150 may be formed on the gate insulation film 40 using the same material as the scan line 120 and the gate electrodes 51, 52, 53 and 54. Also, the second electrodes 56 and 57 of the capacitors C1 and C2 may be on the gate insulation film 40.

In more detail, the gate electrode 51 of the switching transistor M1 and the gate electrode 52 of the diode transistor M2, which may be formed in a branch shape, may be coupled to the scan line 120 and overlap the channel region 31a of the switching transistor M1 and the channel region 32a of the diode transistor M2, respectively. Additionally, the gate electrode 53 of the emission transistor M4 may be separated from the scan line 120 and overlap with the channel region 33a of the semiconductor layer 30. At this time, the gate electrode 53 of the emission transistor M4 may be formed by a portion of the emission control line 140 on the same layer. The emission control line 140 may form the gate electrode 53 of the emission transistor M4 while extending in a row direction and overlapping the channel region 33a of the emission transistor M4. Also, the gate electrode 54 of the driving transistor M3 may be separated from the scan line 120 and overlap with the channel region 34a of the driving transistor M3.

Thereafter, the source regions 31b, 32b, 33b and 34b, drain regions 31c, 32c, 33c and 34c for the transistors M1, M2, M4 and M3 are respectively formed. The source regions 31b, 32b, 33b and 34b and the drain regions 31c, 32c, 33c and 34c may be doped with p-type or n-type impurities according to driving conditions.

Thereafter, a first interlayer insulation film 60 may be formed.

Contact holes h3 and h7 may be formed in the first interlayer insulation film 60 to couple the second electrodes of the capacitors C1 and C2 to the gate electrode 54 of the driving transistor M3, And, contact hole h1, h2, h4, h5, h8 may be formed in the gate insulation 40 and the first interlayer film 60.

Thereafter, the conductive layer 135, the data line 110, the power line 130, a connection electrode 71 of the emission transistor M4 are formed on the first interlayer insulation film 60.

The conductive layer 135 may have a "L"-like shape connected to the capacitors C1 and C2 through the contact hole h7, starting from the drain region 31c of the switching transistor M1, passing over the gate electrode 54 of the driving transistor M3, and traversing the emission control line 140. Accordingly, the capacitors and the driving transistor M3 form a node at the gate electrode 54 of the driving transistor M3 through the conductive layer 135 formed on the first interlayer insulation film 60.

At this time, the upper side of the gate electrode 54 of the driving transistor M3 is empty since the source and drain regions 34c of the driving transistor M3 are coupled to the power line 130 and the diode transistor M2, respectively, via the semiconductor layer 30, rather than via the conductive layer 135. Namely, the driving transistor M3 has the drain region 34c of the semiconductor layer 30 that may be coupled to the drain region 32c of the diode transistor M2, which may be formed of the same material and in the same layer as the drain region 34c of the driving transistor M3. Further, the source region 34b of the driving transistor M3 may be coupled to the power line 130 through the contact hole h4 in the gate insulation film 40 and the first interlayer insulation film 60.

Accordingly, the conductive layer 135 may be contacted on the gate electrode 54 of the driving transistor M3, and it couples the drain region 31c of the switching transistor M1 and the gate electrode 54 of the driving transistor M3 to each other through the contact holes h2 and h3. Additionally, since the conductive layer 135 couples the gate electrode 54 of the driving transistor M3 to the second electrodes 56 and 57 of the capacitors C1 and C2 through the contact hole h7, a node having the shortest distance where the switching transistor M1, the driving transistor M3 and the capacitors intersect at the gate electrode 54 of the driving transistor M3 may be formed. Accordingly, a space in which the pixel circuit is disposed may be reduced, and relatively, a space in which the organic light emitting element OLED is disposed may be widened, thereby increasing the panel's aperture ratio. (See FIG. 9).

The data line 110 may be formed on the first interlayer insulation film 60, and it may extend in a column direction. Further, it may be coupled to the source region 31b of the switching transistor M1 and the source region 32b of the diode transistor M2 through the contact hole h1 passing through the first interlayer insulation film 60 and the gate insulation film 40.

Similarly, the power line 130 may be formed on the first interlayer insulation film 60, and it may extend in the column direction. Further, it may be coupled to the source region 34b of the driving transistor M3 through the contact hole h4 passing through the first interlayer insulation film 60 and the gate insulation film 40.

Additionally, the connection electrode 71 of the emission transistor M4 may be formed with the same material and in the same layer as the data line 110 and the power line 130. Namely, the connection electrode 71 may be coupled to the drain region 33c of the emission transistor M4 through the contact hole h5 passing through the first interlayer insulation film 60 and the gate insulation film 40.

Thereafter, a second interlayer insulation film 80, which may be made from silicon nitride, silicon oxide, organic insulation material or other like substances, may be formed on the data line 110, the power line 130, and the connection electrode 71 of the emission transistor M4. The second interlayer insulation film 80 may have the contact hole h6 for coupling the organic light emitting element OLED to the connection electrode 71 of the emission transistor M4.

Thereafter, a pixel electrode 81 of the organic light emitting element OLED, which may be formed on the second interlayer insulation film 80, may be coupled to the connection electrode 71 of the emission transistor M4 through the contact hole h6. The pixel electrode 81 may be formed with reflective material, such as aluminum or silver alloy. Alternatively, the pixel electrode 81 may be formed with transparent material such as indium tin oxide (ITO) or indium zinc oxide (IZO). The pixel electrode 81 made from transparent conductive material may be applied to an organic EL display utilizing the bottom emission method to display an image at the rear of the display panel. The pixel electrode 81 made from non-transparent conductive material may be applied to an organic EL display utilizing the top emission method to display an image at the front of the display panel.

Thereafter, a partition wall 83, which may be made from organic insulation material to seperate organic emitting cells from each other, may be formed on the second interlayer insulation film 80. The partition wall 83 may surround the pixel electrode 81 to define a region of the organic light emitting element OLED. The partition wall 83 serves as a light-blocking film by exposing and developing a photosensitive agent including a black paint. Also, the partition wall 83 may simplify a film forming process. An organic emission layer 85 may be formed on the pixel electrode 81. The organic emitting element OLED comprises the organic emission layer 85, which may emit red, green or blue light.

Thereafter, a buffer layer 90 may be formed on the organic emission layer 85 and the partition wall 83. The buffer layer 90 may be omitted.

Thereafter, a common electrode 95 may be formed on the buffer layer 90. The common electrode 95 may be made from transparent conductive material such as ITO or IZO. The common electrode 95 may also be made from reflective metal, such as aluminum.

Additionally, an auxiliary electrode (not shown) may be formed with a low-resistance metal to enhance the conductivity of the common electrode 95. The auxiliary electrode may be formed between the common electrode 95 and the buffer layer 90, or it may be formed on the common electrode 95. Also, the auxiliary electrode is preferably formed in the form of a matrix along the partition wall 83 so that it does not overlap with the organic emission layer 85.

As is apparent from the above description, with the organic EL display panel according to exemplary embodiments of the present invention, since the current flowing through the organic light emitting element OLED may be controlled with a large value of current, driving the display panel by precise current programming is possible. Also, a deviation in brightness between pixels may be alleviated by compensating for a deviation in threshold voltage or mobility between pixels, which may occur in processes for fabricating transistors.

Particularly, compactly arranging transistors within a small space widens a space in which the organic light emitting element is disposed, thereby increasing the display panel's aperture ratio.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro luminescent (EL) display panel comprising at least one pixel circuit for driving each pixel, wherein the pixel circuit comprises:

at least one organic light emitting element per pixel;

at least two thin film transistors per pixel; and at least one capacitor per pixel, wherein the thin film transistors respectively comprise a gate electrode and a semiconductor layer in which a channel region, a source region and a drain region are formed; and wherein a conductive layer contacted on the gate electrode of one of thin film transistors is coupled to another thin film transistor and at least one capacitor.

2. The organic EL display panel of claim 1, wherein the semiconductor layer of the thin film transistors is formed as a common layer.

3. The organic EL display panel of claim 1, further comprising:

a data line and a power line in parallel to each other; and a scan line, an emission control line, and a boost control line in parallel to each other and intersecting the data line and the power line, wherein a first region is defined by the data line, the power line, the scan line, and the emission control line;

wherein a second region is defined by the boost control line, the emission control line, the data line, and the power line, and wherein the pixel circuit is formed in the first region and the second region.

4. The organic EL display panel of claim 3, wherein the at least two thin film transistors are formed in the first region; and wherein the at least one capacitor and the organic light emitting element are formed in the second region.

5. The organic EL display panel of claim 3, wherein the pixel circuit includes:

a first thin film transistor and a second thin film transistor for transporting a data current from the data line in response to a selection signal from the scan line;

a third thin film transistor for supplying a driving current to the organic light emitting element;

a fourth thin film transistor for transporting the driving current from the third thin film transistor to the organic light emitting element;

a first capacitor to be charged to a first voltage corresponding to the data current from the first thin film transistor; and a second capacitor coupled between the first capacitor and the boost control line for changing the first voltage of the first capacitor to a second voltage, wherein the third thin film transistor is diode-coupled while the data current is transported from the first thin film transistor and the second thin film transistor.

6. The organic EL display panel of claim 5, wherein the first thin film transistor is formed in a region where the data line and the scan line intersect, wherein the second thin film transistor is formed in a region where the data line and the emission control line intersect, wherein the third thin film transistor is formed in a region where the scan line and the power line intersect, and wherein the fourth thin film transistor is formed across the emission control line.

7. The organic EL display panel of claim 6, wherein a drain region of the first thin film transistor is coupled to the third thin film transistor and the capacitors by the conductive layer.

8. The organic EL display panel of claim 7, wherein the conductive layer has a "L" like shape starting from the drain region of the first thin film transistor, passing over a gate electrode of the third thin film transistor, and traversing the emission control line.

9. The organic EL display panel of claim 8, wherein the gate electrode of the third thin film transistor is coupled to the drain region of the first thin film transistor and the capacitors via the conductive layer through a contact hole exposing the gate electrode of the third thin film transistor.

10. The organic EL display panel of claim 9, wherein the third thin film transistor is coupled to the second thin film transistor through the semiconductor layer, and wherein the semiconductor layer extends across the emission control line to the second region to form a drain region of the fourth thin film transistor.

11. The organic EL display panel of claim 6, wherein the conductive layer is formed on a same insulation film and is formed of a same material as the data line and the power line.

* * * * *